US010475409B2

(12) United States Patent
Han et al.

(10) Patent No.: US 10,475,409 B2
(45) Date of Patent: Nov. 12, 2019

(54) GATE DRIVE CIRCUIT, DISPLAY PANEL, AND DRIVING METHOD FOR THE GATE DRIVE CIRCUIT

(71) Applicant: BOE Technology Group Co., Ltd., Beijing (CN)

(72) Inventors: Mingfu Han, Beijing (CN); Xing Yao, Beijing (CN); Guangliang Shang, Beijing (CN); Haoliang Zheng, Beijing (CN); Seung-Woo Han, Beijing (CN); Jiha Kim, Beijing (CN); Lijun Yuan, Beijing (CN); Zhichong Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 190 days.

(21) Appl. No.: 15/796,463

(22) Filed: Oct. 27, 2017

(65) Prior Publication Data

US 2018/0261177 A1   Sep. 13, 2018

(30) Foreign Application Priority Data

Mar. 9, 2017   (CN) ........................... 2017 1 0138008

(51) Int. Cl.
| | |
|---|---|
| *G11C 19/00* | (2006.01) |
| *G09G 3/36* | (2006.01) |
| *G06F 3/041* | (2006.01) |
| *G11C 19/28* | (2006.01) |

(52) U.S. Cl.
CPC ......... *G09G 3/3677* (2013.01); *G06F 3/0412* (2013.01); *G06F 3/0416* (2013.01); *G09G 2310/0286* (2013.01); *G09G 2310/0291* (2013.01); *G09G 2310/08* (2013.01); *G09G 2330/021* (2013.01); *G09G 2340/0407* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 2007/0014390 A1* | 1/2007 | Huang | .................... | G11C 19/00 377/64 |
| 2007/0274432 A1* | 11/2007 | Yu | ........................... | G11C 19/28 377/64 |

(Continued)

*Primary Examiner* — Tuan T Lam
(74) *Attorney, Agent, or Firm* — Arent Fox LLP; Michael Fainberg

(57) ABSTRACT

The present disclosure discloses a gate drive circuit, a display panel and a driving method for the gate drive circuit. The gate drive circuit includes a plurality of shift register units connected in cascade; and further includes: buffer units which are in a one-to-one correspondence with shift register units at all levels, and touch control switch units which are in a one-to-one correspondence with shift register units at even levels. Each buffer unit in the gate drive circuit can increase the holding time of the effective pulse signal output by the shift register unit at a corresponding level by one line before resetting, and the effective pulse signal output by a buffer unit at an even level under the control of a touch control unit and the effective pulse signal output by a buffer unit at an adjacent previous odd level are reset at the same time.

20 Claims, 14 Drawing Sheets

(56) References Cited

U.S. PATENT DOCUMENTS

| | | | |
|---|---|---|---|
| 2008/0100560 A1* | 5/2008 | Na | G09G 3/3677 345/101 |
| 2016/0100007 A1* | 4/2016 | Prahlad | G06F 3/0605 709/219 |
| 2017/0047128 A1* | 2/2017 | Dai | G11C 19/28 |
| 2017/0103698 A1* | 4/2017 | Xiao | G09G 3/2085 |

* cited by examiner

US 10,475,409 B2

GATE DRIVE CIRCUIT, DISPLAY PANEL, AND DRIVING METHOD FOR THE GATE DRIVE CIRCUIT

CROSS-REFERENCE TO RELATED APPLICATION

This Application claims priority to Chinese Patent Application No. 201710138008.8, filed on Mar. 9, 2017, the content of which is incorporated by reference in the entirety.

TECHNICAL FIELD

The present disclosure relates to the field of display technologies, and particularly to a gate drive circuit, a display panel and a driving method for the gate drive circuit.

DESCRIPTION OF THE RELATED ART

In a thin-film transistor display, a gate drive device is usually used to supply gate drive signals to gates of various Thin Film Transistors (TFTs) in a pixel region. The gate drive device may be formed on an array substrate of a liquid crystal display via an array process, i.e. a Gate Driver on Array (GOA) process. This process not only saves costs, but also realizes a symmetrical and beautiful design on both sides of a liquid crystal panel, meanwhile, omits a bonding region and a fan-out wiring space of a gate integrated circuit, thereby realizing a design of narrow frame. Moreover, this process may also omit a bonding process in a direction of gate scan lines, thereby improving the productivity and the yield.

At present, minimizing the power consumption is always a key problem of the panel design, wherein reducing the resolution is an effective solution for lowering the power consumption, which needs a switching of resolution supported by a GOA circuit, i.e. both a line-by-line scanning and a scanning of two lines at the same time can be realized. Therefore, how to enable the GOA circuit to support the switching of resolution becomes an urgent technical problem to be solved in this field.

SUMMARY

Embodiments of the present disclosure provide a gate drive circuit, a display panel and a driving method for the gate drive circuit.

In one aspect, an embodiment of the present disclosure provides a gate drive circuit, including a plurality of shift register units connected in cascade, wherein an output end of a shift register unit at level n is connected to an input end of a shift register unit at level n+x; a reset end of the shift register unit at level n is connected to an output end of the shift register unit at level n+x, wherein x is an integer greater than 1, n is an arbitrary integer greater than 0 and less than or equal to N−x, and N represents a total number of shift register units included in the gate drive circuit; wherein the gate drive circuit further includes buffer units which are in a one-to-one correspondence with shift register units at all levels, and touch control switch units which are in a one-to-one correspondence with shift register units at even levels, wherein a buffer unit at level m is connected to an output end of a shift register unit at level m and an output end of a shift register unit at level m+1+x, and configured to start outputting an effective pulse signal when the output end of the shift register unit at level m outputs an effective pulse signal, and to stop outputting the effective pulse signal output by the buffer unit at level m when the output end of the shift register unit at level m+1+x outputs an effective pulse signal, wherein m is an arbitrary odd number between 1 and N−1−x; a buffer unit at level k is connected to an output end of a shift register unit at level k, an output end of a shift register unit at level k+1+x and a touch control switch unit corresponding to the shift register unit at level k, and configured to output an effective pulse signal under control of the touch control switch unit corresponding to the shift register unit at level k only when the output end of the shift register unit at level k outputs an effective pulse signal, or configured to start outputting an effective pulse signal when the output end of the shift register unit at level k outputs an effective pulse signal, and to stop outputting the effective pulse signal output by the buffer unit at level k when the output end of the shift register unit at level k+1+x outputs an effective pulse signal, wherein k is an arbitrary even number between 1 and N−1−x.

In another aspect, an embodiment of the present disclosure further provides a display panel, including a gate drive circuit, the gate drive circuit includes a plurality of shift register units connected in cascade, wherein an output end of a shift register unit at level n is connected to an input end of a shift register unit at level n+x; a reset end of the shift register unit at level n is connected to an output end of the shift register unit at level n+x, wherein x is an integer greater than 1, n is an arbitrary integer greater than 0 and less than or equal to N−x, and N represents a total number of shift register units included in the gate drive circuit; wherein the gate drive circuit further includes buffer units which are in a one-to-one correspondence with shift register units at all levels, and touch control switch units which are in a one-to-one correspondence with shift register units at even levels, wherein a buffer unit at level m is connected to an output end of a shift register unit at level m and an output end of a shift register unit at level m+1+x, and configured to start outputting an effective pulse signal when the output end of the shift register unit at level m outputs an effective pulse signal, and to stop outputting the effective pulse signal output by the buffer unit at level m when the output end of the shift register unit at level m+1+x outputs an effective pulse signal, wherein m is an arbitrary odd number between 1 and N−1−x; a buffer unit at level k is connected to an output end of a shift register unit at level k, an output end of a shift register unit at level k+1+x and a touch control switch unit corresponding to the shift register unit at level k, and configured to output an effective pulse signal under control of the touch control switch unit corresponding to the shift register unit at level k only when the output end of the shift register unit at level k outputs an effective pulse signal, or configured to start outputting an effective pulse signal when the output end of the shift register unit at level k outputs an effective pulse signal, and to stop outputting the effective pulse signal output by the buffer unit at level k when the output end of the shift register unit at level k+1+x outputs an effective pulse signal, wherein k is an arbitrary even number between 1 and N−1−x.

In still another aspect, an embodiment of the present disclosure further provides a driving method for the gate drive circuit of embodiments of the present disclosure, the method includes: when the gate drive circuit needs to operate in a first mode, controlling the shift register units connected in cascade to output effective pulse signals in sequence, and controlling each of the buffer units which are in a one-to-one correspondence with the shift register units at all levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal; or when the gate drive circuit needs to operate in a second mode, controlling the shift register units connected in cascade to output effective pulse signals in sequence, and controlling each of buffer units which are in a one-to-one correspondence with shift register units at odd levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal, and controlling each of the buffer units which are in a one-to-one correspondence with the shift register units at even levels to output an effective pulse signal under control of a touch control switch unit corresponding to a shift register unit at a corresponding even level only when an output end of said shift register unit at the corresponding even level outputs an effective pulse signal.

BRIEF DESCRIPTION OF THE DRAWINGS

In order to make the technical solutions according to the embodiments of the present disclosure more apparent, the drawings to which a description of the embodiments refers will be briefly introduced below, and apparently the drawings to be described below are merely illustrative of some of the embodiments of the present disclosure, and those ordinarily skilled in the art can derive from these drawings other drawings without any inventive effort.

DETAILED DESCRIPTION OF THE EMBODIMENTS

In the related art, the switching of resolution in the GOA circuit is achieved primarily by adjusting the phase relationship of clock signals via a Timer Control Register (TCON), which not only results in the delay of clock signals, resulting in poor image display, but also imposes a high requirement to the TCON, increasing the development costs of the TCON.

In view of this, embodiments of the present disclosure provide a gate drive circuit, a display panel and a driving method for the gate drive circuit, and the GOA circuit can realize the switching of resolution without modifying a TCON, thereby reducing the power consumption of the display panel.

In order to make the objects, technical solutions, and advantages of the embodiments of the present disclosure more apparent, the technical solutions according to the embodiments of the present disclosure will be described below clearly and fully with reference to the drawings in the embodiments of the present disclosure, and apparently the embodiments described below are only a part but not all of the embodiments of the present disclosure. Based upon the embodiments here of the present disclosure, all the other embodiments which can occur to those skilled in the art without any inventive effort shall fall into the scope of the present disclosure.

It shall be appreciated that the following descriptions of some embodiments presented herein are merely intended to illustrate and describe, but not to limit the present disclosure.

Figure 1:
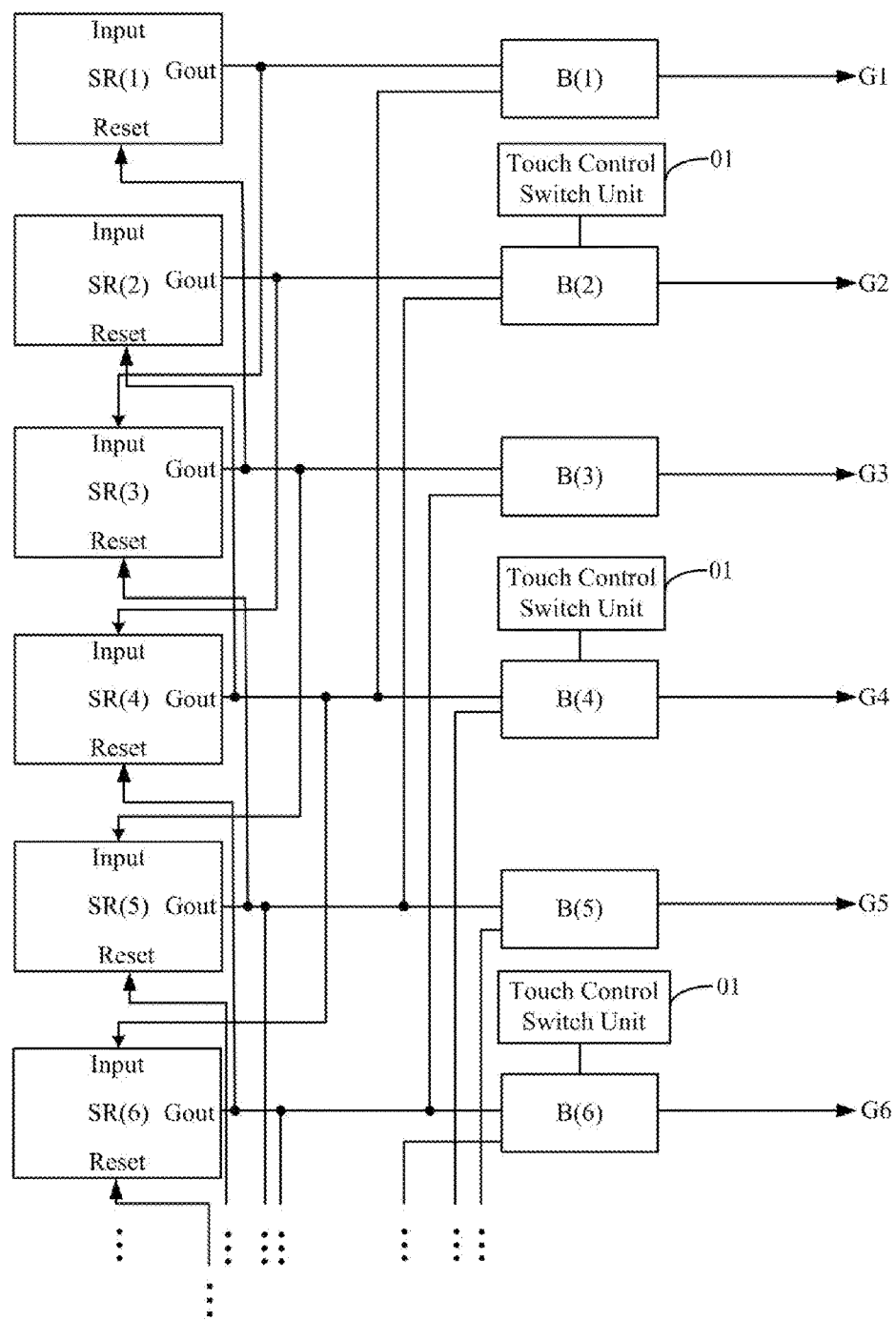
FIG. 1 is a first structural schematic diagram of the gate drive circuit provided in the embodiments of the present disclosure.

The gate drive circuit provided in the embodiments of the present disclosure includes a plurality of shift register units connected in cascade, i.e., SR(1), SR(2), SR(3), SR(4), SR(5), SR(6), . . . as illustrated in FIG. 1, wherein an output end of a shift register unit at level n, SR(n), is connected to an input end of a shift register unit at level n+x, SR(n+x); a reset end of the shift register unit at level n, SR(n), is connected to an output end of the shift register unit at level n+x, SR(n+x); wherein x is an integer greater than 1, and n is an arbitrary integer greater than 0 and less than or equal to N−x, and N represents a total number of shift register units included in the gate drive circuit; wherein the description is made by taking x=2 as an example in FIG. 1. For example, an output end of a shift register unit at level 1, SR(1), is connected to an input end of a shift register unit at level 3, SR(3), and an output end of a shift register unit at level 2, SR(2) is connected to an input end of a shift register unit at level 4, SR (4); a reset end of the shift register unit at level 1, SR(1), is connected to an output end of the shift register unit at level 3, SR(3); and other shift register units at all levels have the same connection logic relationship, which will not be repeated herein in detail. In addition, it should be noted that, in embodiments of the present disclosure, an output end of each shift register unit can be marked as Gout, an input end of each shift register unit can be marked as Input, and a reset end of each shift register unit can be marked as Reset.

As illustrated in FIG. 1, the gate drive circuit further includes: buffer units B(n), which are in a one-to-one correspondence with shift register units at all levels, and touch control switch units 01 which are in a one-to-one correspondence with shift register units at even levels; for example, SR(1) corresponds to B(1), SR(2) corresponds to B(2), SR(3) corresponds to B(3), SR(4) corresponds to B(4), . . . ; and each of B(2), B(4) and B(6) is connected to a touch control switch unit 01.

A buffer unit at level m, B(m), is connected to an output end of a shift register unit at level m, SR(m), and an output end of a shift register unit at level m+1+x, SR(m+1+x), and configured to start outputting an effective pulse signal when the output end of the shift register unit at level m, SR(m), outputs an effective pulse signal, and to stop outputting the effective pulse signal output by the buffer unit at level m, B(m), when the output end of the shift register unit at level m+1+x, SR(m+1+x), outputs an effective pulse signal, wherein m is an arbitrary odd number between 1 and N−1−x. For example, the buffer unit at level 1, B(1), is connected to the output end of the shift register unit at level 1, SR(1), and the output end of the shift register unit at level 4, SR(4), and configured to output an effective pulse signal from the time the output end of the shift register unit at level 1, SR(1), outputs an effective pulse signal to the time the output end of the shift register unit at level 4, SR(4), outputs an effective pulse signal.

A buffer unit at level k, B(k), is connected to an output end of a shift register unit at level k, SR(k), an output end of a shift register unit at level k+1+x, SR(k+1+x), and a touch control switch unit 01 corresponding to the shift register unit at level k, SR(k), and configured to output an effective pulse signal under the control of the touch control switch unit 01 corresponding to the shift register unit at level k, SR(k), only when the output end of the shift register unit at level k, SR(k), outputs an effective pulse signal; or configured to start outputting an effective pulse signal when the output end of the shift register unit at level k, SR(k), outputs an effective pulse signal, and to stop outputting the effective pulse signal output by the buffer unit at level k, B(k), when the output end of the shift register unit at level k+1+x, SR (k+1+x), outputs an effective pulse signal, wherein k is an arbitrary even number between 1 and N−1−x. For example, the buffer unit at level 2, B(2), is connected to the output end of the shift register unit at level 2, SR(2), the output end of the shift register unit at level 5, SR(5), and the touch control switch unit 01 corresponding to the shift register unit at level 5, SR(5), and configured to output an effective pulse signal under the control of the touch control switch unit 01 corresponding to the shift register unit at level 5, SR(5), only when the output end of the shift register unit at level 2, SR(2), outputs an effective pulse signal; or configured to output an effective pulse signal from the time the output end of the shift register unit at level 2, SR(2), outputs an effective pulse signal to the time the output end of the shift register unit at level 5, SR(5), outputs an effective pulse signal.

The gate drive circuit provided in the embodiments of the present disclosure includes a plurality of shift register units connected in cascade, a plurality of buffer units which are in a one-to-one correspondence with shift register units at all levels, and a plurality of touch control switch units which are in a one-to-one correspondence with shift register units at even levels. The shift register units connected in cascade in the gate drive circuit output effective pulse signals in sequence, and when the gate drive circuit needs to operate in a high-definition mode, each of the buffer units which are in a one-to-one correspondence with the shift register units at all levels starts to output an effective pulse signal when the output end of the shift register unit at a corresponding level outputs an effective pulse signal, and stops to output its effective pulse signal when the output end of the shift register unit at level 1+x thereafter outputs an effective pulse signal, that is, each of buffer units at all levels in the gate drive circuit can extend the holding time of the effective pulse signal output by the shift register unit at a corresponding level by one line before resetting, realizing the function of line-by-line scanning. When the gate drive circuit needs to operate in a low power consumption mode, each of buffer units which are in a one-to-one correspondence with shift register units at odd levels starts to output an effective pulse signal when the output end of the shift register unit at a corresponding level outputs an effective pulse signal, and stops to output its effective pulse signal when the output end of the shift register unit at level 1+x thereafter outputs an effective pulse signal; each of buffer units which are in a one-to-one correspondence with shift register units at even levels outputs an effective pulse signal under the control of a touch control switch unit corresponding to a shift register unit at a corresponding even level only when the output end of the shift register unit at the corresponding even level outputs an effective pulse signal, that is, each of buffer units at odd levels in the gate drive circuit can extend the holding time of the effective pulse signal output by the shift register unit at a corresponding level by one line before resetting, while the effective pulse signal output by a buffer unit at an even level under the control of a touch control switch unit and the effective pulse signal output by a buffer unit at an adjacent previous odd level are reset at the same time, realizing the function of simultaneous two-line scanning. Therefore, the gate drive circuit provided in the embodiments of the present disclosure can realize the switching of resolution in a GOA circuit, without modifying a TCON, thereby reducing the power consumption of a display panel.

In some embodiments, x is determined by the number of clock signals required by the shift register units connected in cascade, 2x, and therefore, the greater x is, the greater the number of the clock signals required by the shift register units connected in cascade is. In general, x is set as 2, 3 or 4, so that the number of the clock signals required by the shift register units connected in cascade is 4, 6 or 8 in sequence, which will not be limited herein.

Figure 2A:
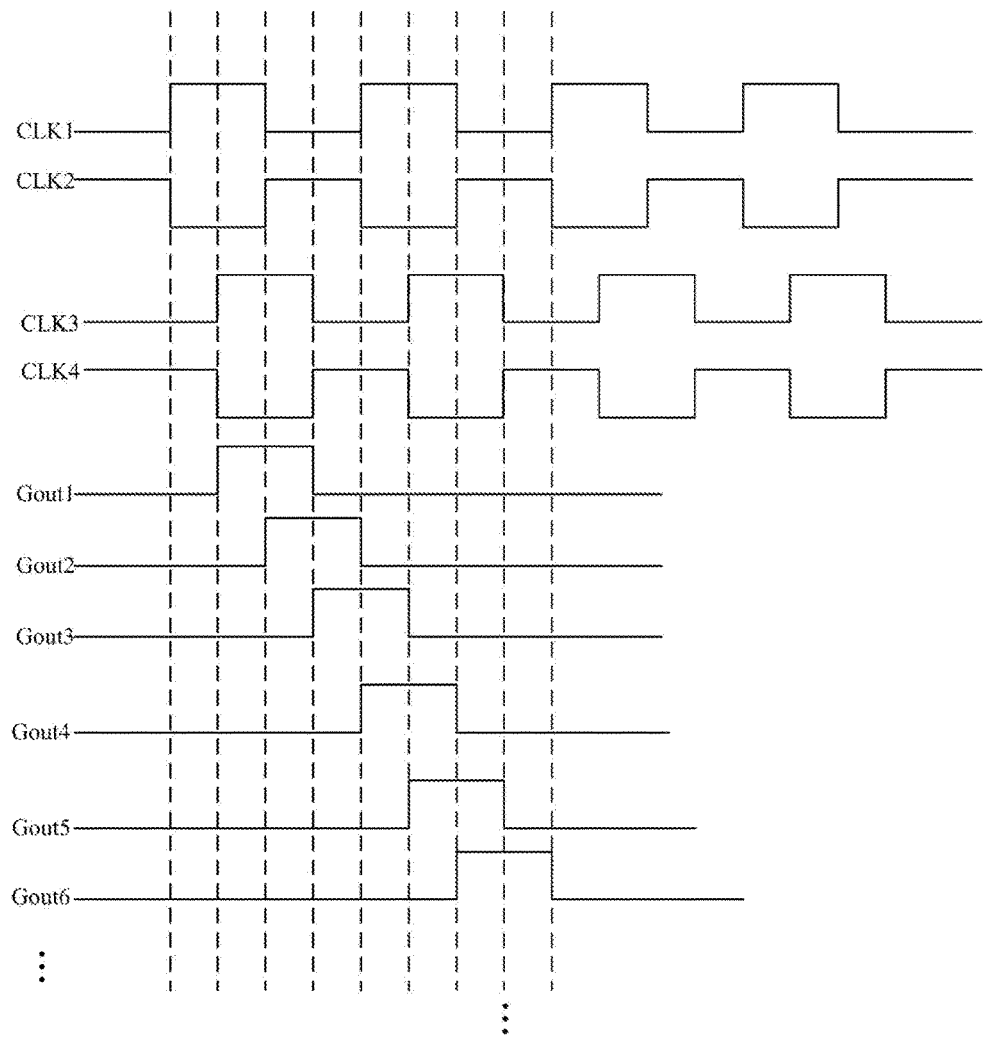
FIG. 2A is a first output time sequence diagram of a shift register unit in the related art.
Figure 2B:
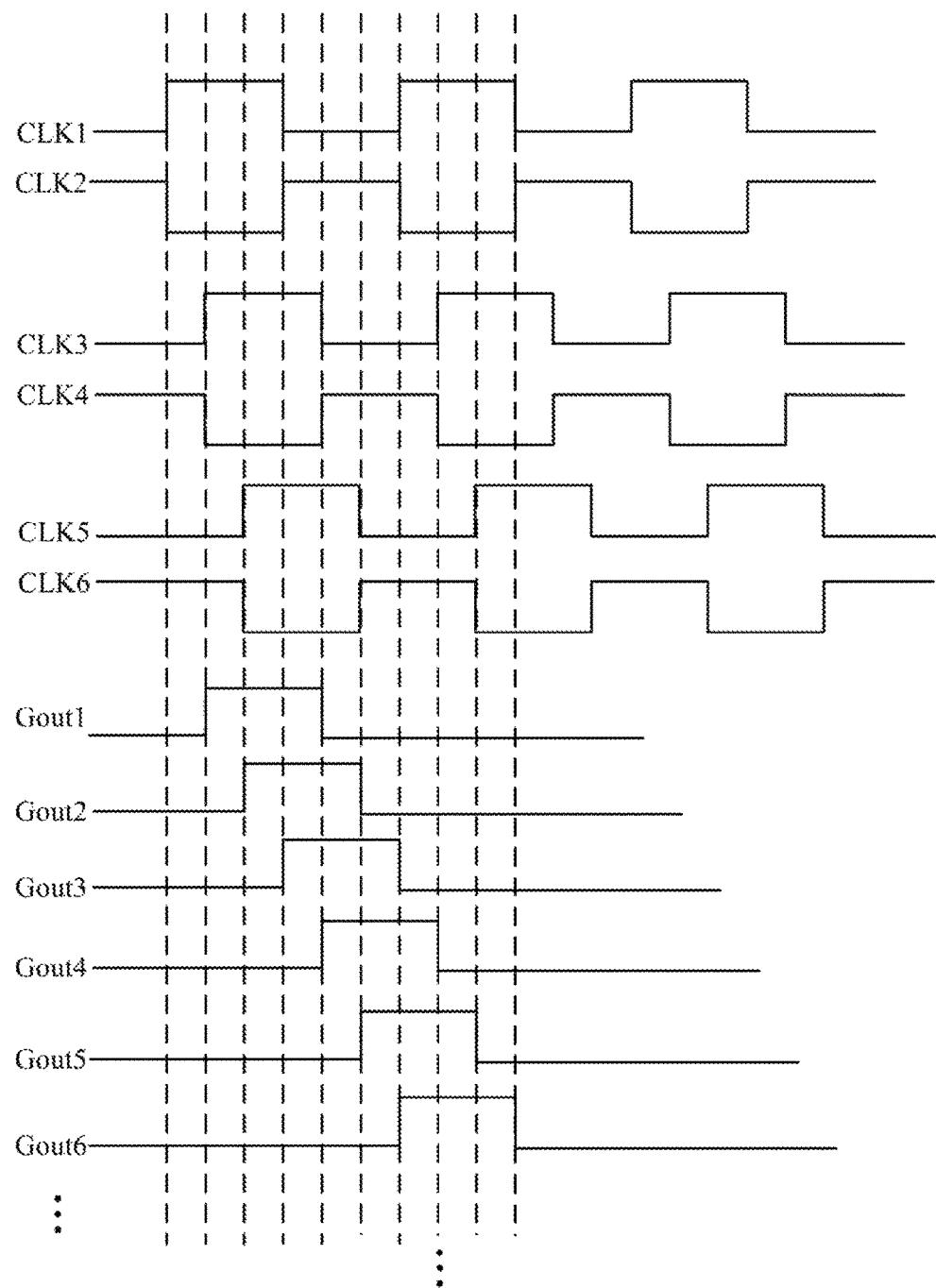
FIG. 2B is a second output time sequence diagram of a shift register unit in the related art.
Figure 2C:
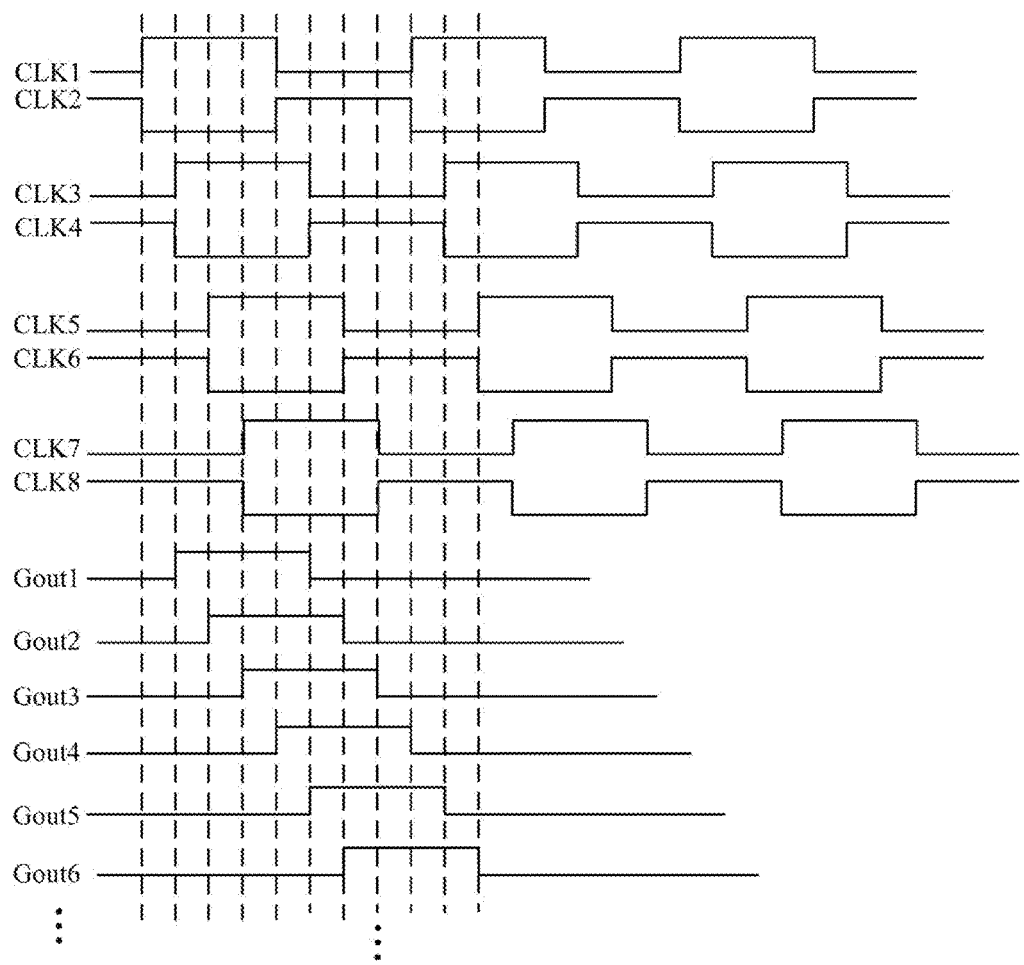
FIG. 2C is a third output time sequence diagram of a shift register unit in the related art.

In the above gate drive circuit provided in the embodiments of the present disclosure, the shift register units connected in cascade are those existing shift register units which can output effective pulse signals level by level. For example, if x=2, four clock signals CLK1-CLK4 are needed, the corresponding time sequence of the clock signals and its corresponding sequential output time sequence are illustrated in FIG. 2A; if x=3, six clock signals CLK1-CLK6 are needed, the corresponding time sequence of the clock signals and its corresponding sequential output time sequence are illustrated in FIG. 2B; and if x=4, eight clock signals CLK1-CLK8 are needed, the corresponding time sequence of the clock signals and its corresponding sequential output time sequence are illustrated in FIG. 2C. It should be noted that, as illustrated in FIG. 2A, FIG. 2B or FIG. 2C, Gout 1 represents the output end of a shift register unit at level 1, Gout 2 represents the output end of a shift register unit at level 2, Gout 3 represents the output end of a shift register unit at level 3, Gout 4 represents the output end of a shift register unit at level 4, Gout 5 represents the output end of a shift register unit at level 5, Gout 6 represents the output end of a shift register unit at level 6, . . . .

Figure 3:
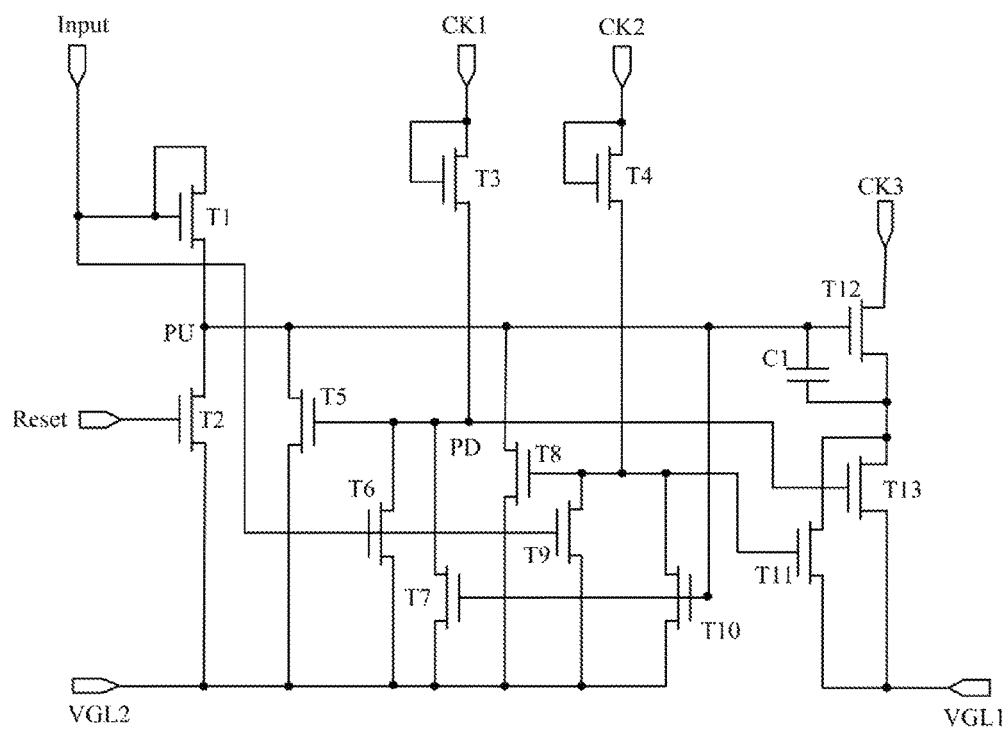
FIG. 3 is a structural schematic diagram of a shift register unit in the related art.

In the above gate drive circuit provided in the embodiments of the present disclosure, the shift register unit is described by taking the structure as illustrated in FIG. 3 as an example, but which will not be limited to this. The shift register unit includes thirteen switch transistors T1-T13 and a capacitor C1, wherein a gate of T1 and a first electrode of T1 are both connected to an input end, Input, of the shift register unit, and a second electrode of T1 is connected to a first node PU; a gate of T2 is connected to a reset end, Reset, of the shift register unit, and a second electrode of T2 is connected to a second potential end VGL2; a gate of T3 and a first electrode of T3 are both connected to a first clock signal end CK1, and a second electrode of T3 is connected to a second node PD; a gate of T4 and a first electrode of T4 are both connected to a second clock signal end CK2, and a second electrode of T4 is connected to the gates of T8 and T11; the CK1 and CK2 are two contrary clock signals, the second electrodes of T2, T5, T6, T7, T8, T9 and T10 are connected to the second potential end VGL2, the first electrodes of T2, T5 and T8 are connected to the PU, the first electrodes of T6 and T7 are connected to the PD, the first electrode of T9 and T10 are connected to the gate of T8, the gate of T10 is connected to the gate of T7 and the PU, the second electrode of T11 is connected to a first potential end VGL1, and the first electrode of T11 is connected to the first electrode of T13; the second electrode of T13 is connected to the first potential end VGL1, and the gate of T13 is connected to the PD; a gate of T12 is connected to the PU, a first electrode of T12 is connected to a third clock signal end CK3, and a second electrode of T12 is connected to the first electrode of T13; and the capacitor C1 is connected between the gate and the second electrode of T12. Because the structural of the shift register unit is an existing structure, its specific operating principle will not be described in detail herein.

The above description only illustrates a specific structure of a shift register unit in the gate drive circuit, and during the implementation, the structure of the shift register unit will not be limited to the above-mentioned structure provided in the embodiments of the present disclosure, and also can be other structures known by those skilled in the art, which will not be limited herein.

The present disclosure is described below in detail in combination with specific embodiments. It should be understood that the embodiments are used for better explaining the present disclosure, not used for limiting the present disclosure.

Figure 4:
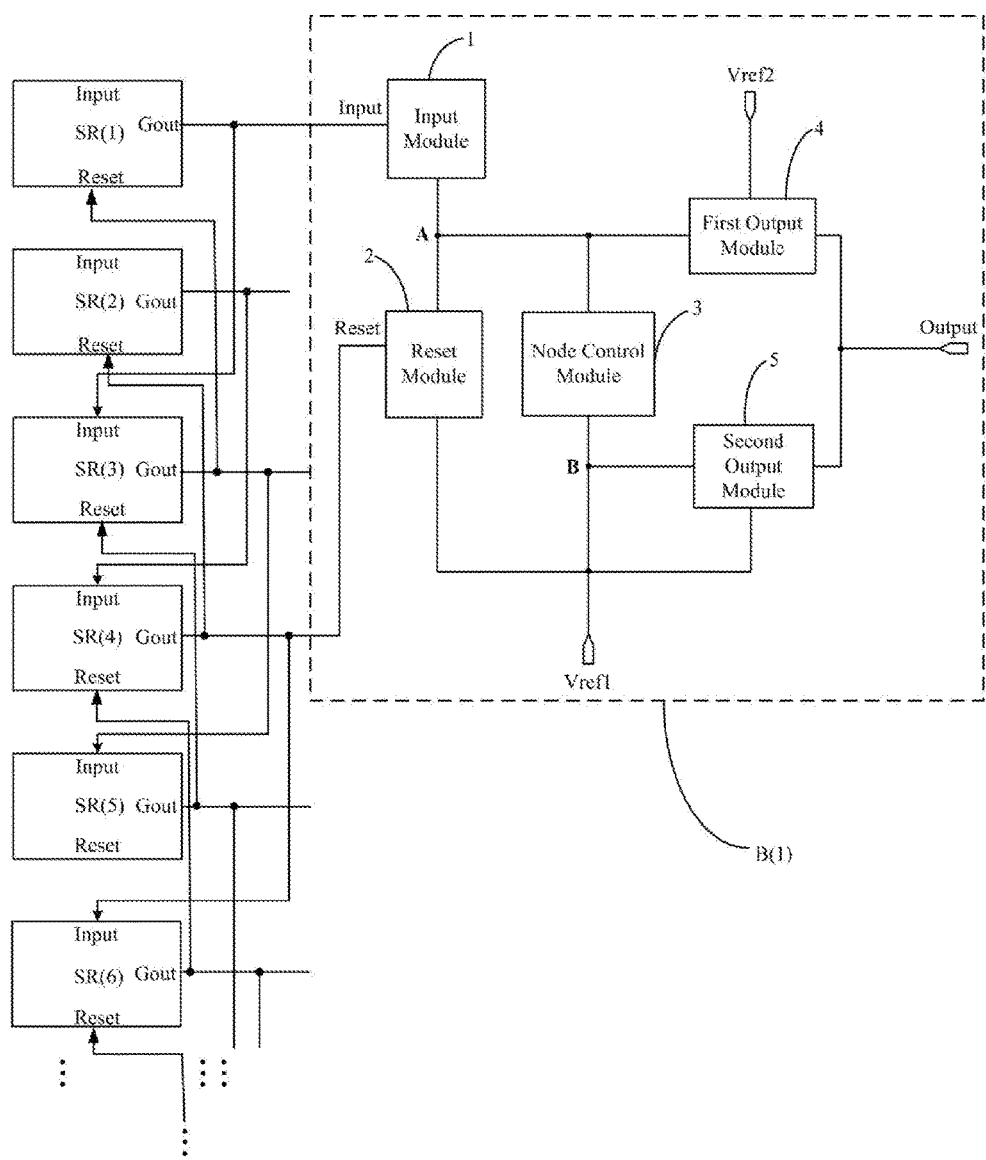
FIG. 4 is a second structural schematic diagram of the gate drive circuit provided in the embodiments of the present disclosure.

In some embodiments, in the gate drive circuit provided in the embodiments of the present disclosure, as illustrated in FIG. 4, the buffer unit B (n) corresponding to the shift register unit at level n, SR(n), includes (in FIG. 4, the illustration is made by taking n=1 as an example): an input module 1, a reset module 2, a node control module 3, a first output module 4 and a second output module 5.

The input module 1 is configured to supply a signal from the output end of the shift register unit at level n, SR(n), to a first node A under the control of the output end of the shift register unit at level n, SR (n).

The reset module 2 is configured to supply a signal from a first reference voltage end Vref1 to the first node A under the control of an output end of a shift register unit at level n+1+x, SR (n+1+x).

The node control module 3 is configured to control the first node A and the second node B to have opposite potentials, and to control the first node A to have a high potential after the output end of the shift register unit at level n, SR(n), outputs a signal and before the output end of the shift register unit at level n+x, SR(n+x), outputs a signal.

The first output module 4 is configured to supply a signal from a second reference voltage end Vref2 to an output end, Output, of the buffer unit B(n) under the control of the first node A.

The second output module 5 is configured to supply the signal from the first reference voltage end Vref1 to the output end, Output, of the buffer unit B(n) under the control of the second node B.

In some embodiments, in the above gate drive circuit provided in the embodiments of the present disclosure, as illustrated in FIG. 5A, FIG. 5B, FIG. 6A and FIG. 6B (only illustrating the structure of the buffer unit B(n)), the node control module 3 includes: a first node control submodule 3_1 and a second node control submodule 3_2.

The first node control submodule 3_1 is configured to supply the signal from the first reference voltage end Vref1 to the first node A under the control of the second node B, and to further improve the potential of the first node A under the control of a node control end, boot, wherein the node control end, boot, is connected to the output end (not illustrated) of the shift register unit at level n+1, n+2 . . . or n+x.

The second node control submodule 3_2 is configured to supply the signal from the second reference voltage end Vref2 to the second node B under the control of the second reference voltage end Vref2, and to supply the signal from the first reference voltage end Vref1 to the second node B under the control of the first node A.

In some embodiments, in the above gate drive circuit provided in the embodiments of the present disclosure, as illustrated in FIG. 5A, FIG. 5B, FIG. 6A and FIG. 6B, the first node control submodule 3_1 includes: a first switch transistor M1 and a capacitor C.

For the first switch transistor M1, a gate of the first switch transistor M1 is connected to the second node B, a first electrode of the first switch transistor M1 is connected to the first node A, and a second electrode of the first switch transistor M1 is connected to the first reference voltage end Vref1; and for the capacitor C, a first end of the capacitor C is connected to the first node A, and a second end of the capacitor C is connected to the node control end, boot.

The above description only illustrates the specific structure of the first node control submodule in the gate drive circuit, and during the implementation, the structure of the first node control submodule will not be limited to the above-mentioned structure provided in the embodiments of the present disclosure, and also can be other structures known by those skilled in the art, which will not be limited herein.

In some embodiments, in the above gate drive circuit provided in the embodiments of the present disclosure, as illustrated in FIG. 5A, FIG. 5B, FIG. 6A and FIG. 6B, the second node control submodule 3_2 includes: a second switch transistor M2 and a third switch transistor M3.

For the second switch transistor M2, a gate of the second switch transistor M2 and a first electrode of the second switch transistor M2 are both connected to the second reference voltage end Vref2, and a second electrode of the second switch transistor M2 is connected to the second node B; and for the first switch transistor M3, a gate of the third switch transistor M3 is connected to the first node A, a first electrode of the third switch transistor M3 is connected to the second node B, and a second electrode of the third switch transistor M3 is connected to the first reference voltage end Vref1.

In some embodiments, in the above gate drive circuit provided in the embodiments of the present disclosure, in general, the size of the third switch transistor is configured to be larger than the size of the second switch transistor when a process is prepared, so that when the first node has a high potential, the rate of the third switch transistor supplying the signal from the first reference voltage end to the second node under the control of the signal from the first node is larger than the rate of the second switch transistor supplying the signal from the second reference voltage end to the second node under the control of the second reference voltage end, thereby ensuring the second node has a low potential.

The above description only illustrates the specific structure of the second node control submodule in the gate drive circuit, and during the implementation, the structure of the second node control submodule will not be limited to the above-mentioned structure provided in the embodiments of the present disclosure, and also can be other structures known by those skilled in the art, which will not be limited herein.

In some embodiments, in the above gate drive circuit provided in the embodiments of the present disclosure, as illustrated in FIG. 5A, FIG. 5B, FIG. 6A and FIG. 6B, the input module 1 includes: a fourth switch transistor M4.

For the fourth switch transistor M4, a gate of the fourth switch transistor M4 and a first electrode of the fourth switch transistor M4 are both connected to the output end of the shift register unit at level n (i.e., the input end, Input, of the buffer unit B(n) corresponding to the shift register unit at level n), and a second electrode of the fourth switch transistor M4 is connected to the first node A.

The above description only illustrates the specific structure of the input module in the gate drive circuit, and during the implementation, the structure of the input module will not be limited to the above-mentioned structure provided in the embodiments of the present disclosure, and also can be other structures known by those skilled in the art, which will not be limited herein.

In some embodiments, in the above gate drive circuit provided in the embodiments of the present disclosure, as illustrated in FIG. 5A, FIG. 5B, FIG. 6A and FIG. 6B, the reset module 2 includes: a fifth switch transistor M5.

For the fifth switch transistor M5, a gate of the fifth switch transistor M5 is connected to the output end of the shift register unit at level n+1+x, a first electrode of the fifth switch transistor M5 is connected to the first node A, and a second electrode of the fifth switch transistor M5 is connected to the first reference voltage end Vref1.

The above description only illustrates the specific structure of the reset module in the gate drive circuit, and during the implementation, the structure of the reset module will not be limited to the above-mentioned structure provided in the embodiments of the present disclosure, and also can be other structures known by those skilled in the art, which will not be limited herein.

In some embodiments, in the above gate drive circuit provided in the embodiments of the present disclosure, as illustrated in FIG. 5A, FIG. 5B, FIG. 6A and FIG. 6B, the first output module 4 includes: a sixth switch transistor M6.

For the sixth switch transistor M6, a gate of the sixth switch transistor M6 is connected to the first node A, a first electrode of the sixth switch transistor M6 is connected to the second reference voltage end Vref2, and a second electrode of the sixth switch transistor M6 is connected to the output end, Output, of the buffer unit B(n).

The above description only illustrates the specific structure of the first output module in the gate drive circuit, and during the implementation, the structure of the first output module will not be limited to the above-mentioned structure provided in the embodiments of the present disclosure, and also can be other structures known by those skilled in the art, which will not be limited herein.

In some embodiments, in the above gate drive circuit provided in the embodiments of the present disclosure, as illustrated in FIG. 5A, FIG. 5B, FIG. 6A and FIG. 6B, the second output module 5 includes: a seventh switch transistor M7.

For the seventh switch transistor M7, a gate of the seventh switch transistor M7 is connected to the second node B, a first electrode of the seventh switch transistor M7 is connected to the output end, Output, of the buffer unit B(n), and a second electrode of the seventh switch transistor M7 is connected to the first reference voltage end Vref1.

The above description only illustrates the specific structure of the second output module in the gate drive circuit, and during the implementation, the structure of the second output module will not be limited to the above-mentioned structure provided in the embodiments of the present disclosure, and also can be other structures known by those skilled in the art, which will not be limited herein.

Figure 6A:
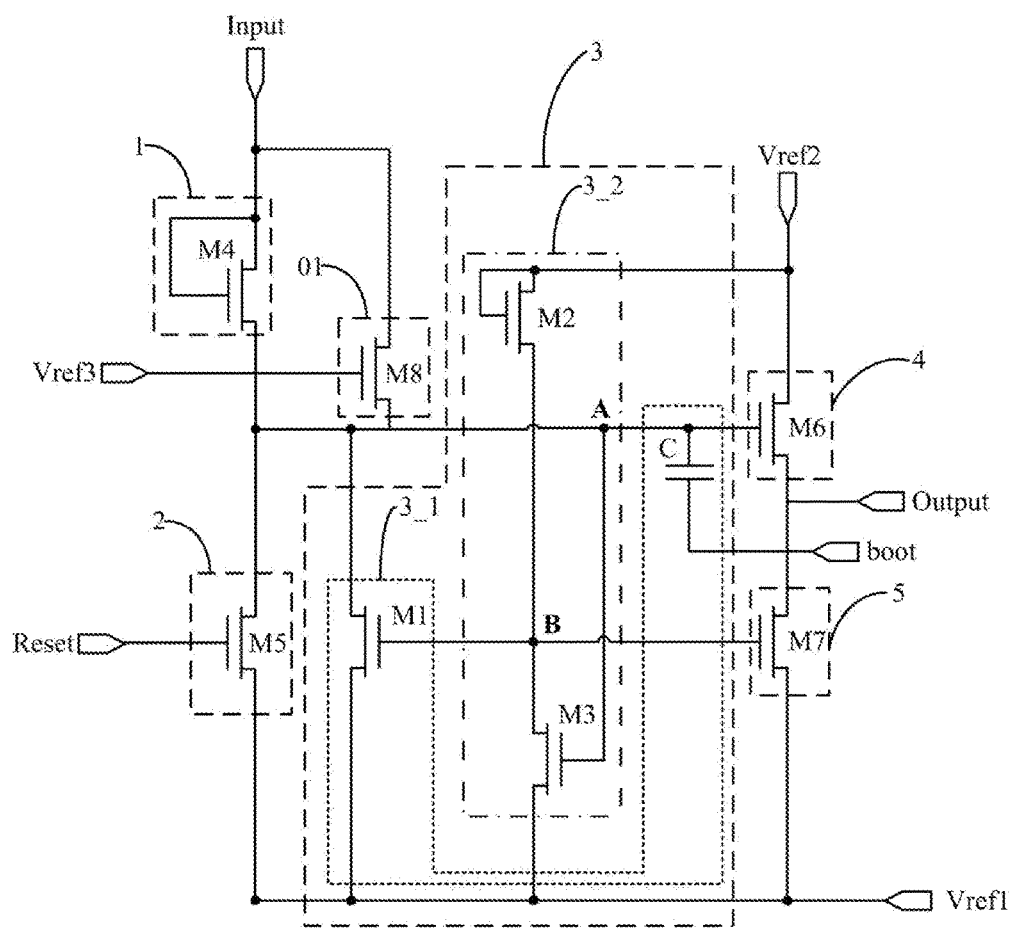
FIG. 6A is a third structural schematic diagram of the buffer unit provided in the embodiments of the present disclosure.
Figure 6B:
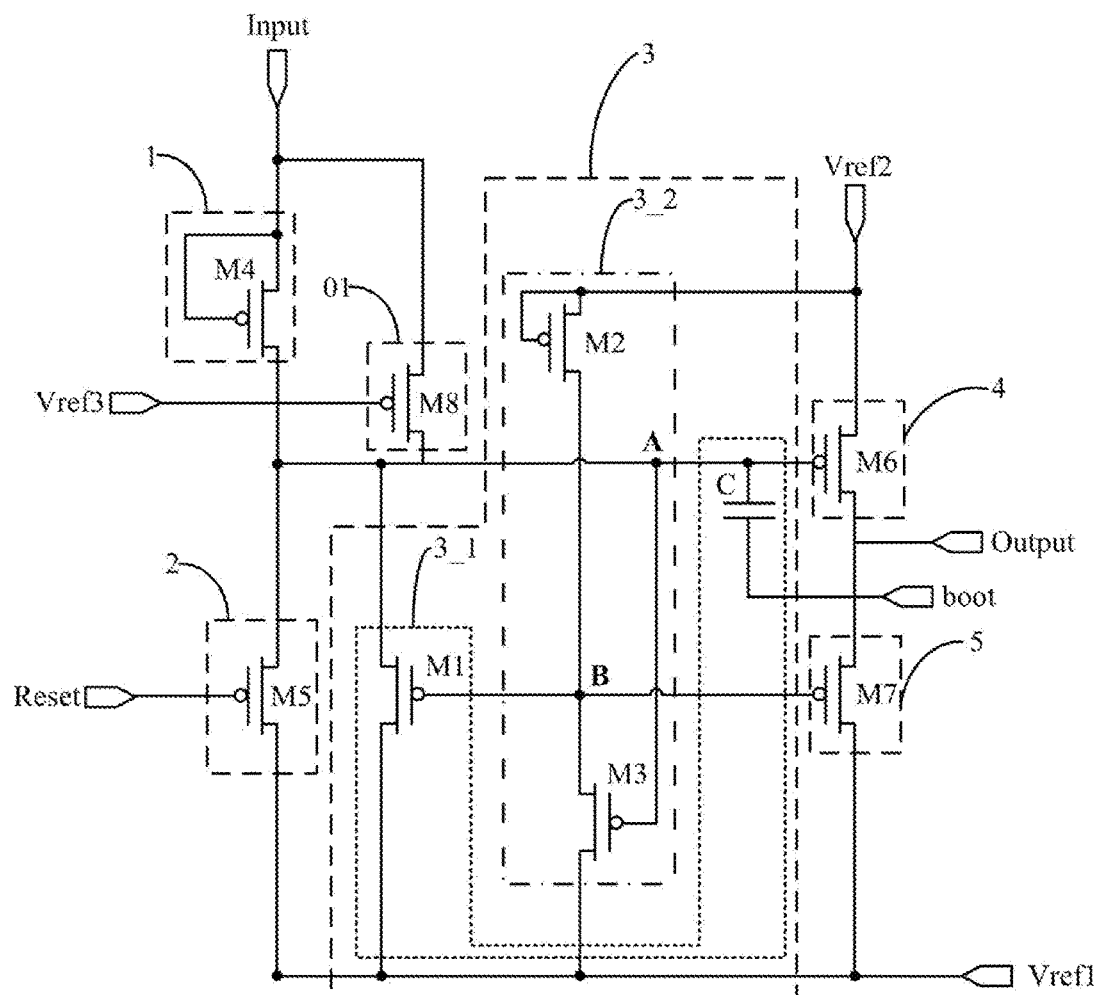
FIG. 6B is a fourth structural schematic diagram of the buffer unit provided in the embodiments of the present disclosure.

In some embodiments, in the above gate drive circuit provided in the embodiments of the present disclosure, as shown in FIG. 6A and FIG. 6B, each of the touch control switch units 01 corresponding to the shift register units at even levels includes: an eighth switch transistor M8.

For the eighth switch transistor M8, a gate of the eighth switch transistor M8 is connected to the third reference voltage end, a first electrode of the eighth switch transistor M8 is connected to the output end of the shift register unit at a corresponding level (the input end, Input, of the buffer unit connected to the shift register unit at the corresponding level), and a second electrode of the eighth switch transistor M8 is connected to the first node A.

The above description only illustrates the specific structure of the touch control switch unit in the gate drive circuit, and during the implementation, the structure of the touch control switch unit will not be limited to the above-mentioned structure provided in the embodiments of the present disclosure, and also can be other structures known by those skilled in the art, which will not be limited herein.

In some embodiments in order to reduce the power consumption of a display panel, in the above gate drive circuit provided in the embodiments of the present disclosure, the signals from the second reference voltage end are direct-current signals.

It is noted that the switch transistors in the above embodiments of the present disclosure may be thin film transistors (TFT), or may be metal oxide semiconductors (MOS), which will not be limited in detail herein.

Figure 5A:
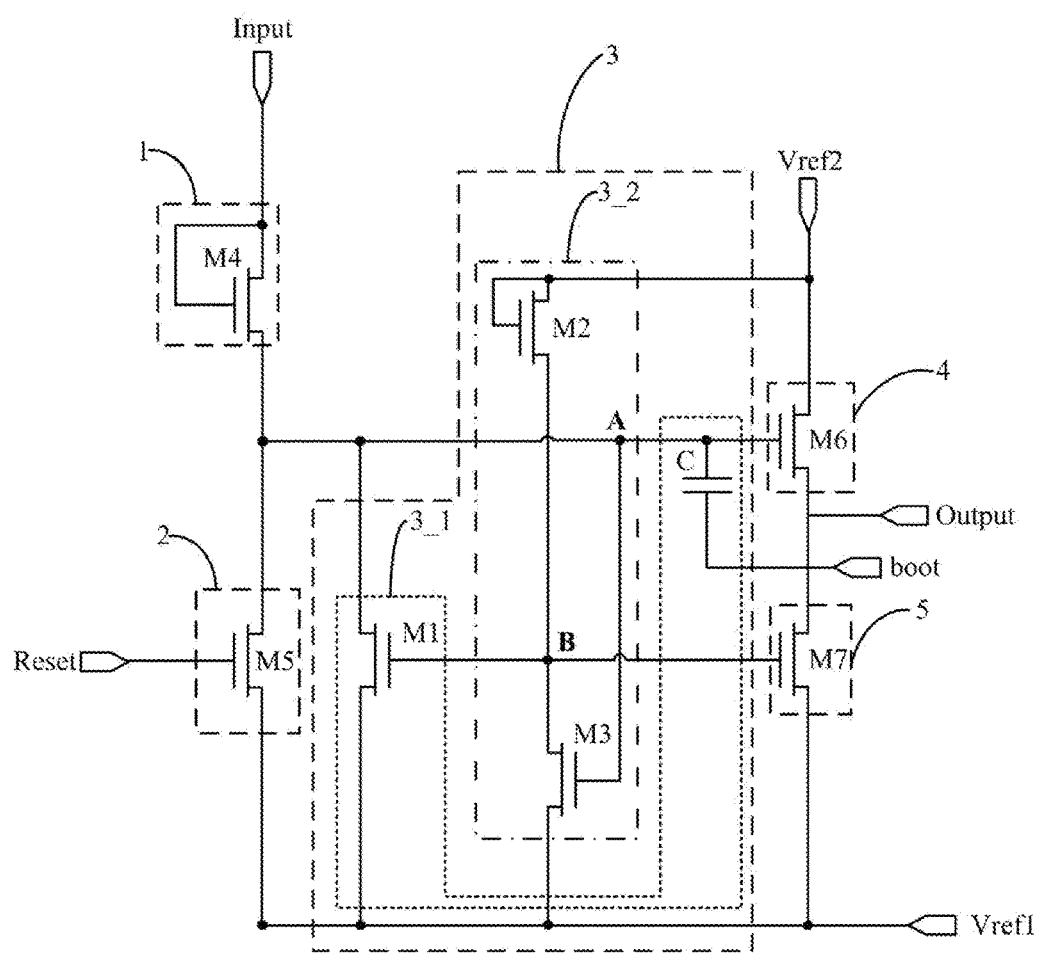
FIG. 5A is a first structural schematic diagram of the buffer unit provided in the embodiments of the present disclosure.
Figure 5B:
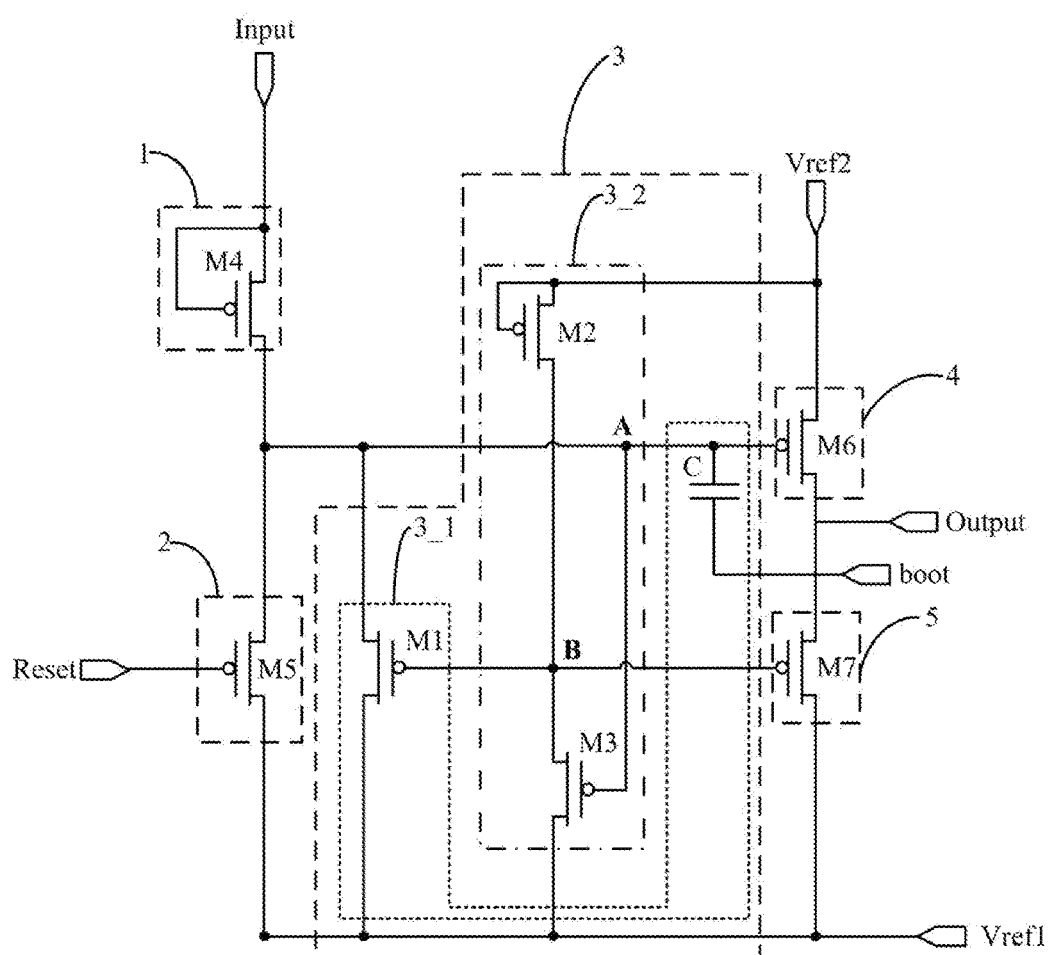
FIG. 5B is a second structural schematic diagram of the buffer unit provided in the embodiments of the present disclosure.

In some embodiments, in the above gate drive circuit provided in the embodiments of the present disclosure, as illustrated in FIG. 5B and FIG. 6B, all switch transistors are P-type transistors; the first reference voltage end Vref1 has a high potential, and the second reference voltage end Vref2 and the third reference voltage end Vref3 have low potentials.

In some embodiments, in the above gate drive circuit provided in the embodiments of the present disclosure, as illustrated in FIG. 5B and FIG. 6B, all switch transistors are N-type transistors; the first reference signal end Vref1 has a low potential, and the second reference signal end Vref2 and the third reference signal end Vref3 have high potentials.

In some embodiments, the N-type transistors are turned on under the action of a high potential, and are cut off under the action of a low potential; the P-type transistors are cut off under the action of a high potential, and are turned on under the action of a low potential.

It is noted that for the switch transistors in the above embodiments of the present disclosure, the first electrode may be a source, and the second electrode may be a drain; or the first electrode may be a drain, and the second electrode may be a source, which will not be distinguished in detail herein.

The operation process of the above gate drive circuit in the embodiments of the present disclosure is described below in combination with the circuit time sequence diagram. In the following description, 1 represents a high potential signal, and 0 represents a low potential signal.

It should be noted that the following embodiments are explained by taking the condition that x is equal to 4 and the node control end, boot, is connected to the output end of a shift register unit at the subsequent second level (a shift register unit at level 2 thereafter) as an example, i.e. taking the output time sequence corresponding to the shift register units connected in cascade in the gate drive circuit as the time sequence illustrated in FIG. 2C as an example. The following embodiments are only used for better explaining the present disclosure, not used for limiting the present disclosure.

Figure 5C:
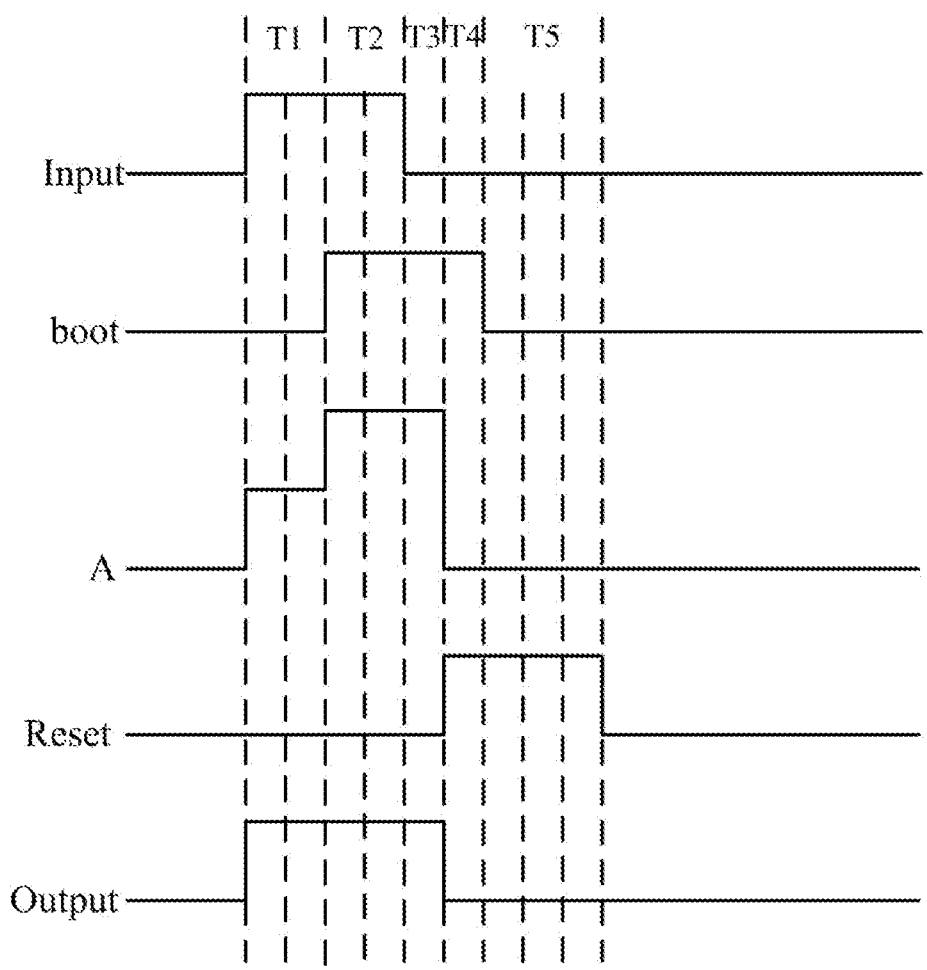
FIG. 5C is an input and output time sequence diagram of a shift register unit at an odd level corresponding to the buffer unit shown in FIG. 5A.

In one embodiment: a buffer unit shown in FIG. 5A is taken as an example. All switch transistors are N-type transistors. The working process of a buffer unit at an odd level is described, and the corresponding input and output time sequences are illustrated in FIG. 5C, including five stages T1 to T5, wherein at the stages T1 to T5, the signal from the first reference voltage end Vref1 is a low-potential signal, and the signal from the second reference voltage end Vref2 is a high-potential signal.

At the stage T1, Input=1, boot=0 and Reset=0.

Because Input=1, the fourth switch transistor M4 is turned on, the high-potential signal from the input end, Input, of the buffer unit is transmitted to the first node A through the fourth switch transistor M4, the potential of the first node A is high, the third switch transistor M3 and the sixth switch transistor M6 are turned on, and the second switch transistor M2 is turned on under the control of the second reference voltage end Vref2; but because the third switch transistor M3 is turned on, the low-potential signal from the first reference voltage end Vref1 is transmitted to the second node B through the third switch transistor M3, the potential of the second node B is low, and the first switch transistor M1 and the seventh switch transistor M7 are cut off; because Reset=0, the fifth switch transistor M5 is cut off; because the sixth switch transistor M6 is turned on, the high-potential signal from the second reference voltage end Vref2 is output to the output end, Output, of the buffer unit through the sixth switch transistor M6, and the potential of the output end, Output, of the buffer unit is high at this stage.

At the stage T2, Input=1, boot=1 and Reset=0.

Because Input=1, the fourth switch transistor M4 is turned on, and the potential of the first node A is still high; because boot=1, the potential of the first node A is further improved, the third switch transistor M3 and the sixth switch transistor M6 are turned on, the low-potential signal from the first reference voltage end Vref1 is transmitted to the second node B through the third switch transistor M3, the potential of the second node B is still low, and the first switch transistor M1 and the seventh switch transistor M7 are cut off; because Reset=0, the fifth switch transistor M5 is cut off; because the sixth switch transistor M6 is turned on, the high-potential signal from the second reference voltage end Vref2 is output to the output end, Output, of the buffer unit through the sixth switch transistor M6, and the potential of the output end, Output, of the buffer unit is still high at this stage.

At the stage T3, Input=0, boot=1 and Reset=0.

Because Input=0, the fourth switch transistor M4 is cut off; because boot=1, the potential of the first node A is still kept high, the third switch transistor M3 and the sixth switch transistor M6 are turned on, the low-potential signal from the first reference voltage end Vref1 is transmitted to the second node B through the third switch transistor M3, the potential of the second node B is low, and the first switch transistor M1 and the seventh switch transistor M7 are cut off; because Reset=0, the fifth switch transistor M5 is cut off; because the sixth switch transistor M6 is turned on, the high-potential signal from the second reference voltage end Vref2 is output to the output end, Output, of the buffer unit through the sixth switch transistor M6, and the potential of the output end, Output, of the buffer unit is still high at this stage.

At the stage T4, Input=0, boot=1 and Reset=1.

Because Input=0, the fourth switch transistor M4 is cut off; because Reset=1, the low-potential signal from the first reference voltage end Vref1 is transmitted to the first node A through the fifth switch transistor M5, and the potential of the first node A is low; even if boot=1, the potential of the first node A is still low at this stage, the third switch transistor M3 and the sixth switch transistor M6 are cut off, the high-potential signal from the second reference voltage end Vref2 is transmitted to the second node B through the second switch transistor M2 under the control of the second reference voltage end Vref2, the potential of the second node B is high, and the first switch transistor M1 and the seventh switch transistor M7 are turned on; the low-potential signal from the first reference voltage end Vref1 is output to the output end, Output, of the buffer unit through the seventh switch transistor M7, and the potential of the output end, Output, of the buffer unit is low at this stage.

At the stage T5, Input=0, boot=0 and Reset=1.

Because Input=0, the fourth switch transistor M4 is cut off; because Reset=1, the low-potential signal from the first reference voltage end Vref1 is transmitted to the first node A through the fifth switch transistor M5, the potential of the first node A is still low, the third switch transistor M3 and the sixth switch transistor M6 are cut off, the high-potential signal from the second reference voltage end Vref2 is transmitted to the second node B through the second switch transistor M2, the potential of the second node B is high, and the first switch transistor M1 and the seventh switch transistor M7 are turned on; the low-potential signal from the first reference voltage end Vref1 is output to the output end, Output, of the buffer unit through the seventh switch transistor M7, and the potential of the output end, Output, of the buffer unit is still low.

Then the potentials of Input, boot and Reset become low, and the potential output by the output end, Output, of the buffer unit is kept the same as the potential output at the stage T5.

Figure 6C:
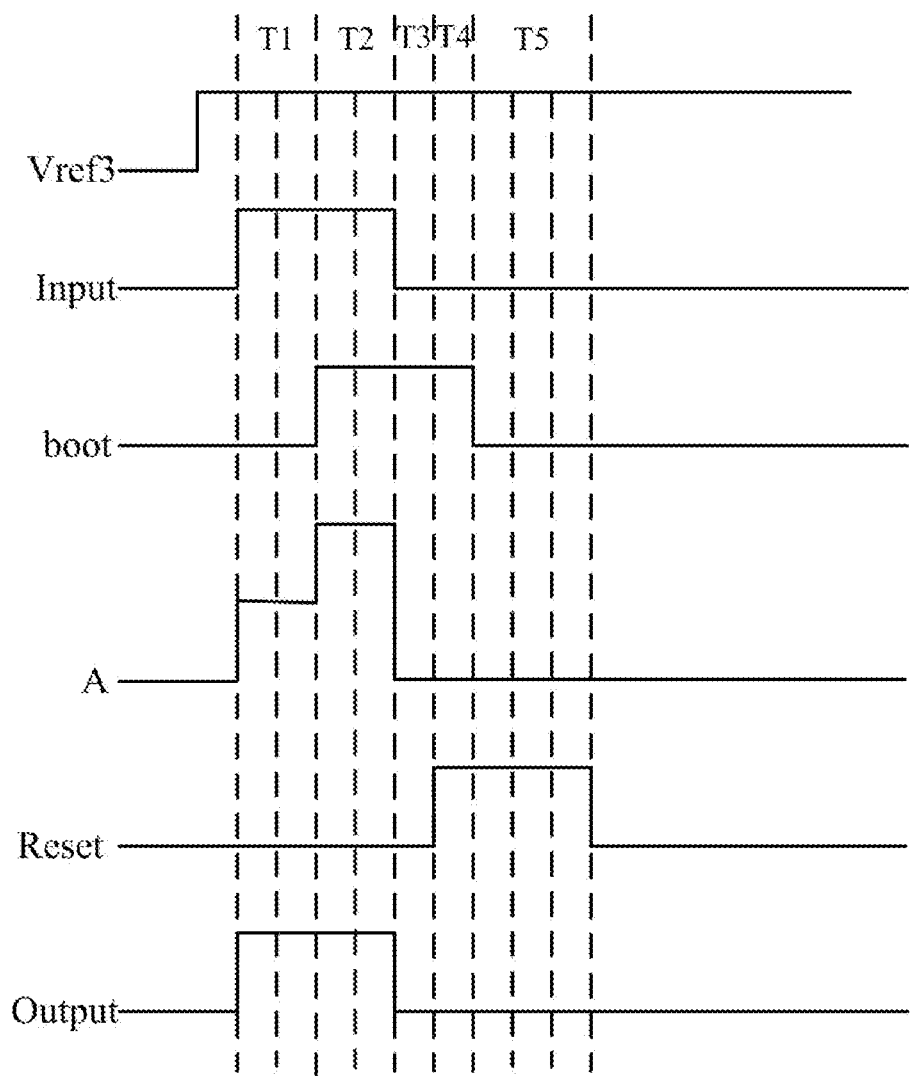
FIG. 6C is an input and output time sequence diagram of a shift register unit at an even level corresponding to the buffer unit shown in FIG. 6A.

In another embodiment: a buffer unit shown in FIG. 6A is taken as an example. All switch transistors are N-type transistors. The working process of a buffer unit at an even level is described, and the corresponding input and output time sequences are illustrated in FIG. 6C, including five stages T1 to T5, wherein at the stages T1 to T5, the signal from a first reference voltage end Vref1 is a low-potential signal, and the signals from a second reference voltage end Vref2 and a third reference voltage end Vref3 are high-potential signals.

At the stage T1, Input=1, boot=0 and Reset=0.

Because Input=1, the fourth switch transistor M4 is turned on, and the high-potential signal from the input end, Input, of the buffer unit is transmitted to the first node A through the fourth switch transistor M4 and the eighth switch transistor M8 under the control of the third reference voltage end Vref3; the potential of the first node A is high, the third switch transistor M3 and the sixth switch transistor M6 are turned on, and the second switch transistor M2 is turned on under the control of the second reference voltage end Vref2; but because the third switch transistor M3 is turned on, the low-potential signal from the first reference voltage end Vref1 is transmitted to the second node B through the third switch transistor M3, the potential of the second node B is low, and the first switch transistor M1 and the seventh switch transistor M7 are cut off; because Reset=0, the fifth switch transistor M5 is cut off; because the sixth switch transistor M6 is turned on, the high-potential signal from the second reference voltage end Vref2 is output to the output end, Output, of the buffer unit through the sixth switch transistor M6, and the potential of the output end, Output, of the buffer unit is high at this stage.

At the stage T2, Input=1, boot=1 and Reset=0.

Because Input=1, the fourth switch transistor M4 is turned on, and the potential of the first node A is still high; because boot=1, the potential of the first node A is further improved, the third switch transistor M3 and the sixth switch transistor M6 are turned on, the low-potential signal from the first reference voltage end Vref1 is transmitted to the second node B through the third switch transistor M3, the potential of the second node B is still low, and the first switch transistor M1 and the seventh switch transistor M7 are cut off; because Reset=0, the fifth switch transistor M5 is cut off; because the sixth switch transistor M6 is turned on, the high-potential signal from the second reference voltage end Vref2 is output to the output end, Output, of the buffer unit through the sixth switch transistor M6, and the potential of the output end, Output, of the buffer unit is still high at this stage.

At the stage T3, Input=0, boot=1 and Reset=0.

Because Input=0, the fourth switch transistor M4 is cut off; the low-potential signal from the input end, Input, of the buffer unit is transmitted to the first node A through the eighth switch transistor M8 under the control of the third reference voltage end Vref3, and the potential of the first node A is low; even if boot=1, the potential of the first node A is still low, the third switch transistor M3 and the sixth switch transistor M6 are cut off, the high-potential signal from the second reference voltage end Vref2 is transmitted to the second node B through the second switch transistor M2, the potential of the second node B is high, and the first switch transistor M1 and the seventh switch transistor M7 are turned on; because Reset=0, the fifth switch transistor M5 is cut off; because the seventh switch transistor M7 is turned on, the low-potential signal from the first reference voltage end Vref1 is output to the output end, Output, of the buffer unit through the seventh switch transistor M7, and the potential of the output end, Output, of the buffer unit is low at this stage.

At the stage T4, Input=0, boot=1 and Reset=1.

Because Input=0, the fourth switch transistor M4 is cut off; because Reset=1, the low-potential signal from the first reference voltage end Vref1 is transmitted to the first node A through the fifth switch transistor M5, and the potential of the first node A is still low; even if boot=1, the potential of the first node A is still low at this stage, the third switch transistor M3 and the sixth switch transistor M6 are cut off, the high-potential signal from the second reference voltage end Vref2 is transmitted to the second node B through the second switch transistor M2 under the control of the second reference voltage end Vref2, the potential of the second node B is high, and the first switch transistor M1 and the seventh switch transistor M7 are turned on; the low-potential signal from the first reference voltage end Vref1 is output to the output end, Output, of the buffer unit through the seventh switch transistor M7, and the potential of the output end, Output, of the buffer unit is still low at this stage.

At the stage T5, Input=0, boot=0 and Reset=1.

Because Input=0, the fourth switch transistor M4 is cut off; because Reset=1, the low-potential signal from the first reference voltage end Vref1 is transmitted to the first node A through the fifth switch transistor M5, the potential of the first node A is still low, the third switch transistor M3 and the sixth switch transistor M6 are cut off, the high-potential signal from the second reference voltage end Vref2 is transmitted to the second node B through the second switch transistor M2, the potential of the second node B is high, and the first switch transistor M1 and the seventh switch transistor M7 are turned on; the low-potential signal from the first reference voltage end Vref1 is output to the output end, Output, of the buffer unit through the seventh switch transistor M7, and the potential of the output end, Output, of the buffer unit is still low.

Then the potentials of Input, boot and Reset become low, and the potential output by the output end, Output, of the buffer unit is kept the same as the potential output at the stage T5.

In still another embodiment: the whole gate drive circuit provided in the embodiments of the present disclosure is taken as an example to describe the working process of the gate drive circuit.

Figure 7A:
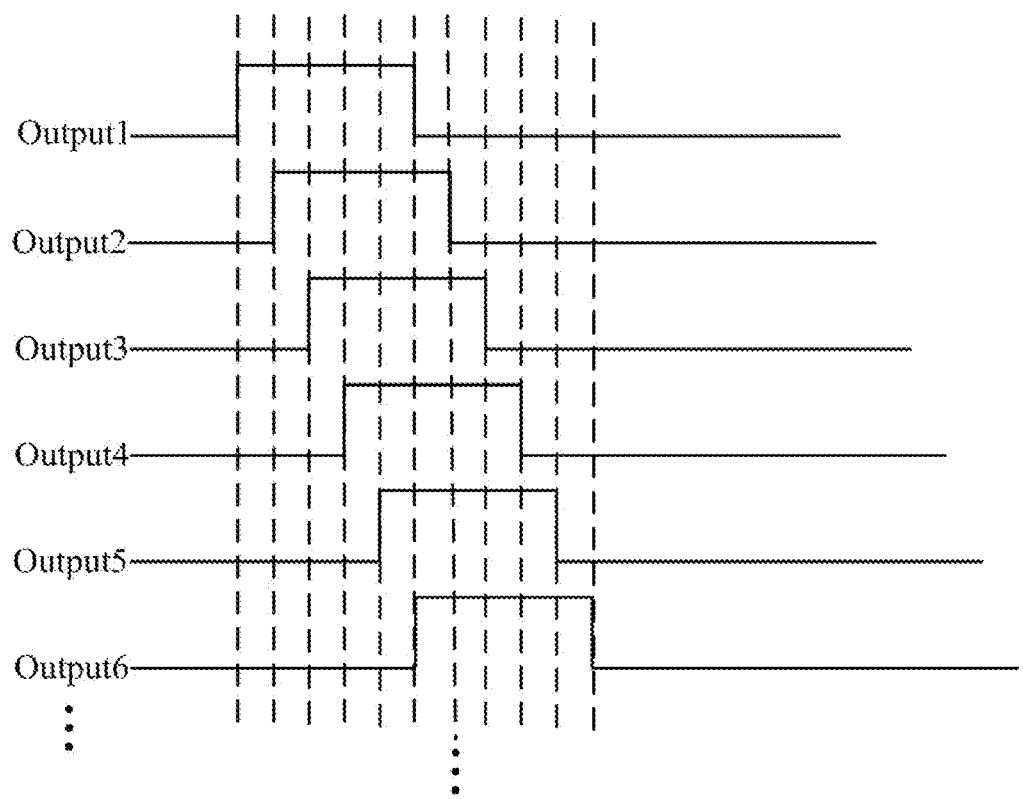
FIG. 7A is a first output time sequence diagram of the operation of the gate drive circuit provided in the embodiments of the present disclosure.

The shift register units connected in cascade in the gate drive circuit output effective pulse signals in sequence, and when the gate drive circuit needs to operate in a high-definition mode, each of the buffer units which are in a one-to-one correspondence with the shift register units at all levels starts to output an effective pulse signal when the output end of the shift register unit at a corresponding level outputs an effective pulse signal, and stops to output its effective pulse signal when the output end of the shift register unit at level 1+x thereafter outputs an effective pulse signal, that is, each of buffer units at all levels in the gate drive circuit can extend the holding time of the effective pulse signal output by the shift register unit at a corresponding level by one line before resetting, realizing the function of line-by-line scanning. In some embodiments, the output time sequences corresponding to the output ends of the buffer units at all levels in the gate drive circuit are illustrated in FIG. 7A, wherein FIG. 7A only shows the signals from the output end, Output1, of the buffer unit at level 1 to the output end, Output6, of the buffer unit at level 6, and the signals from the output ends, Output, of the buffer units at other levels are deduced in this way.

Figure 7B:
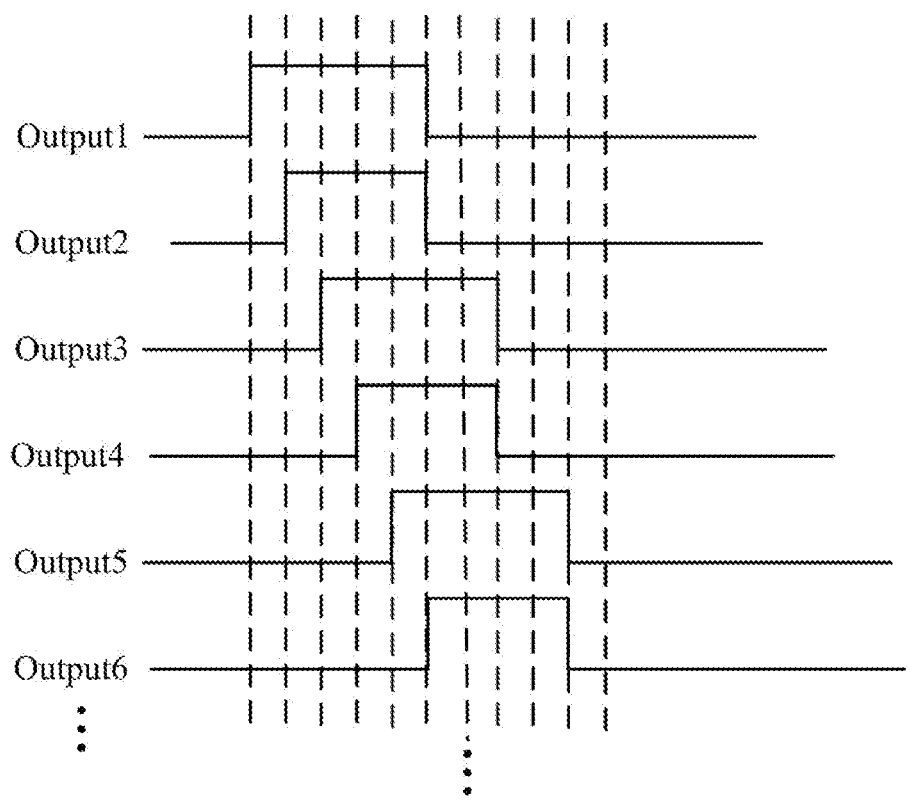
FIG. 7B is a second output time sequence diagram of the operation of the gate drive circuit provided in the embodiments of the present disclosure.

When the gate drive circuit needs to operate in a low power consumption mode, each of buffer units which are in a one-to-one correspondence with shift register units at odd levels starts to output an effective pulse signal when the output end of the shift register unit at a corresponding level outputs an effective pulse signal, and stops to output its effective pulse signal when the output end of the shift register unit at level 1+x thereafter outputs an effective pulse signal; each of buffer units which are in a one-to-one correspondence with shift register units at even levels outputs an effective pulse signal under the control of a touch control switch unit corresponding to a shift register unit at a corresponding even level only when the output end of the shift register unit at the corresponding even level outputs an effective pulse signal, that is, each of buffer units at odd levels in the gate drive circuit can extend the holding time of the effective pulse signal output by the shift register unit at a corresponding level by one line before resetting, while the effective pulse signal output by a buffer unit at an even level under the control of a touch control switch unit and the effective pulse signal output by a buffer unit at an adjacent previous odd level are reset at the same time, realizing the function of simultaneous two-line scanning. In some embodiments, the output time sequences corresponding to the output ends of the buffer units at all levels realizing the function of scanning two lines at the same time in the gate drive circuit are illustrated in FIG. 7B, wherein FIG. 7B only shows the signals from the output end, Output1, of the buffer unit at level 1 to the output end, Output6, of the buffer unit at level 6, and the signals from the output ends, Output, of the buffer units at other levels are deduced in this way. In addition, the detailed working principle of the gate drive circuit provided in the present embodiment of the present disclosure can be seen from the working principles of the two former embodiments, which will not be repeated again.

On the basis of a same inventive concept, the embodiments of the present disclosure also provide a display panel, including the gate drive circuit provided in the embodiments of the present disclosure. The display panel can be a display panel of any product having a display function, such as a mobile phone, a tablet, a television set, a display, a laptop, a digital photo frame, a navigator, etc. The implementation of the display panel can be seen from the above embodiments of the gate drive circuit, which will not be repeated again.

In some embodiments, the above display panel provided in the embodiments of the present disclosure can be a liquid crystal display panel or an organic electroluminescent display panel, which is not limited here.

On the basis of the same inventive concept, the embodiments of the present disclosure also provide a driving method for the gate drive circuit of embodiments of the present disclosure, the method includes: when the gate drive circuit needs to operate in a first mode, controlling the shift register units connected in cascade to output effective pulse signals in sequence, and controlling each of the buffer units which are in a one-to-one correspondence with the shift register units at all levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal; or when the gate drive circuit needs to operate in a second mode, controlling the shift register units connected in cascade to output effective pulse signals in sequence, and controlling each of buffer units which are in a one-to-one correspondence with shift register units at odd levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal, and controlling each of the buffer units which are in a one-to-one correspondence with the shift register units at even levels to output an effective pulse signal under the control of a touch control switch unit corresponding to a shift register unit at a corresponding even level only when an output end of said shift register unit at the corresponding even level outputs an effective pulse signal.

In the gate drive circuit, the display panel and the driving method for the gate drive circuit provided in the embodiments of the present disclosure, the gate drive circuit includes a plurality of shift register units connected in cascade, a plurality of buffer units which are in a one-to-one correspondence with shift register units at all levels, and a plurality of touch control switch units which are in a one-to-one correspondence with shift register units at even levels. The shift register units connected in cascade in the gate drive circuit output effective pulse signals in sequence, and when the gate drive circuit needs to operate in a high-definition mode, each of the buffer units which are in a one-to-one correspondence with the shift register units at all levels starts to output an effective pulse signal when the output end of the shift register unit at a corresponding level outputs an effective pulse signal, and stops to output its effective pulse signal when the output end of the shift register unit at level 1+x thereafter outputs an effective pulse signal, that is, each of buffer units at all levels in the gate drive circuit can extend the holding time of the effective pulse signal output by the shift register unit at a corresponding level by one line before resetting, realizing the function of line-by-line scanning. When the gate drive circuit needs to operate in a low power consumption mode, each of buffer units which are in a one-to-one correspondence with shift register units at odd levels starts to output an effective pulse signal when the output end of the shift register unit at a corresponding level outputs an effective pulse signal, and stops to output its effective pulse signal when the output end of the shift register unit at level 1+x thereafter outputs an effective pulse signal; each of buffer units which are in a one-to-one correspondence with shift register units at even levels outputs an effective pulse signal under the control of a touch control switch unit corresponding to a shift register unit at a corresponding even level only when the output end of the shift register unit at the corresponding even level outputs an effective pulse signal, that is, each of buffer units at odd levels in the gate drive circuit can extend the holding time of the effective pulse signal output by the shift register unit at a corresponding level by one line before resetting, while the effective pulse signal output by a buffer unit at an even level under the control of a touch control switch unit and the effective pulse signal output by a buffer unit at an adjacent previous odd level are reset at the same time, realizing the function of simultaneous two-line scanning. Therefore, the gate drive circuit provided in the embodiments of the present disclosure can realize the switching of resolution in a GOA circuit, without modifying a TCON, thereby reducing the power consumption of a display panel.

Evidently those skilled in the art can make various modifications and variations to the present disclosure without departing from the spirit and scope of the present disclosure. Accordingly the present disclosure is also intended to encompass these modifications and variations thereto so long as the modifications and variations come into the scope of the claims appended to the present disclosure and their equivalents.

The invention claimed is:

1. A gate drive circuit, comprising a plurality of shift register units connected in cascade, wherein an output end of a shift register unit at level n is connected to an input end of a shift register unit at level n+x; a reset end of the shift register unit at level n is connected to an output end of the shift register unit at level n+x, wherein x is an integer greater than 1, n is an arbitrary integer greater than 0 and less than or equal to N−x, and N represents a total number of shift register units comprised in the gate drive circuit; wherein the gate drive circuit further comprising buffer units which are in a one-to-one correspondence with shift register units at all levels, and touch control switch units which are in a one-to-one correspondence with shift register units at even levels, wherein:

a buffer unit at level m is connected to an output end of a shift register unit at level m and an output end of a shift register unit at level m+1+x, and configured to start outputting an effective pulse signal when the output end of the shift register unit at level m outputs an effective pulse signal, and to stop outputting the effective pulse signal output by the buffer unit at level m when the output end of the shift register unit at level m+1+x outputs an effective pulse signal, wherein m is an arbitrary odd number between 1 and N−1−x;

a buffer unit at level k is connected to an output end of a shift register unit at level k, an output end of a shift register unit at level k+1+x and a touch control switch unit corresponding to the shift register unit at level k, and configured to output an effective pulse signal under control of the touch control switch unit corresponding to the shift register unit at level k only when the output end of the shift register unit at level k outputs an effective pulse signal, or configured to start outputting an effective pulse signal when the output end of the shift register unit at level k outputs an effective pulse signal, and to stop outputting the effective pulse signal output by the buffer unit at level k when the output end of the shift register unit at level k+1+x outputs an effective pulse signal, wherein k is an arbitrary even number between 1 and N−1−x.

2. The gate drive circuit of claim 1, wherein a buffer unit corresponding to the shift register unit at level n comprises: an input module, a reset module, a node control module, a first output module and a second output module, wherein:

the input module is configured to supply a signal from the output end of the shift register unit at level n to a first node under control of the output end of the shift register unit at level n;

the reset module is configured to supply a signal from a first reference voltage end to the first node under control of an output end of a shift register unit at level n+1+x;

the node control module is configured to control the first node and a second node to have opposite potentials, and to control the first node to have a high potential after the output end of the shift register unit at level n outputs a signal and before the output end of the shift register unit at level n+x outputs a signal;

the first output module is configured to supply a signal from a second reference voltage end to an output end of the buffer unit corresponding to the shift register unit at level n under control of the first node; and the second output module is configured to supply the signal from the first reference voltage end to the output end of the buffer unit corresponding to the shift register unit at level n under control of the second node.

3. The gate drive circuit of claim 2, wherein the node control module comprises: a first node control submodule and a second node control submodule, wherein:

the first node control submodule is configured to supply the signal from the first reference voltage end to the first node under control of the second node, and to further improve a potential of the first node under control of a node control end, wherein the node control end is connected to an output end of a shift register unit at level n+1, n+2 or n+x; and the second node control submodule is configured to supply the signal from the second reference voltage end to the second node under control of the second reference voltage end, and to supply the signal from the first reference voltage end to the second node under control of the first node.

4. The gate drive circuit of claim 3, wherein the first node control submodule comprises: a first switch transistor and a capacitor, wherein:

for the first switch transistor, a gate of the first switch transistor is connected to the second node, a first electrode of the first switch transistor is connected to the first node, and a second electrode of the first switch transistor is connected to the first reference voltage end; and for the capacitor, a first end of the capacitor is connected to the first node, and a second end of the capacitor is connected to the node control end.

5. The gate drive circuit of claim 3, wherein the second node control submodule comprises: a second switch transistor and a third switch transistor, wherein:

for the second switch transistor, a gate of the second switch transistor and a first electrode of the second switch transistor are both connected to the second reference voltage end, and a second electrode of the second switch transistor is connected to the second node;

for the third switch transistor, a gate of the third switch transistor is connected to the first node, a first electrode of the third switch transistor is connected to the second node, and a second electrode of the third switch transistor is connected to the first reference voltage end.

6. The gate drive circuit of claim 2, wherein the input module comprises: a fourth switch transistor, wherein:

for the fourth switch transistor, a gate of the fourth switch transistor and a first electrode of the fourth switch transistor are both connected to the output end of the shift register unit at level n, and a second electrode of the fourth switch transistor is connected to the first node.

7. The gate drive circuit of claim 2, wherein the reset module comprises: a fifth switch transistor, wherein:

for the fifth switch transistor, a gate of the fifth switch transistor is connected to the output end of the shift register unit at level n+1+x, a first electrode of the fifth switch transistor is connected to the first node, and a second electrode of the fifth switch transistor is connected to the first reference voltage end.

8. The gate drive circuit of claim 2, wherein the first output module comprises: a sixth switch transistor, wherein:

for the sixth switch transistor, a gate of the sixth switch transistor is connected to the first node, a first electrode of the sixth switch transistor is connected to the second reference voltage end, and a second electrode of the sixth switch transistor is connected to the output end of the buffer unit corresponding to the shift register unit at level n.

9. The gate drive circuit of claim 2, wherein the second output module comprises: a seventh switch transistor, wherein:

for the seventh switch transistor, a gate of the seventh switch transistor is connected to the second node, a first electrode of the seventh switch transistor is connected to the output end of the buffer unit corresponding to the shift register unit at level n, and a second electrode of the seventh switch transistor is connected to the first reference voltage end.

10. The gate drive circuit of claim 2, wherein each of touch control switch units corresponding to the shift register units at even levels comprises: an eighth switch transistor, wherein:

for the eighth switch transistor, a gate of the eighth switch transistor is connected to a third reference voltage end, a first electrode of the eighth switch transistor is connected to an output end of a shift register unit at a corresponding level, and a second electrode of the eighth switch transistor is connected to the first node.

11. The gate drive circuit of claim 2, wherein signals from the second reference voltage end are direct-current signals.

12. A display panel, comprising a gate drive circuit, the gate drive circuit comprises a plurality of shift register units connected in cascade, wherein an output end of a shift register unit at level n is connected to an input end of a shift register unit at level n+x; a reset end of the shift register unit at level n is connected to an output end of the shift register unit at level n+x, wherein x is an integer greater than 1, n is an arbitrary integer greater than 0 and less than or equal to N−x, and N represents a total number of shift register units comprised in the gate drive circuit; wherein the gate drive circuit further comprises buffer units which are in a one-to-one correspondence with shift register units at all levels, and touch control switch units which are in a one-to-one correspondence with shift register units at even levels, wherein:

a buffer unit at level m is connected to an output end of a shift register unit at level m and an output end of a shift register unit at level m+1+x, and configured to start outputting an effective pulse signal when the output end of the shift register unit at level m outputs an effective pulse signal, and to stop outputting the effective pulse signal output by the buffer unit at level m when the output end of the shift register unit at level m+1+x outputs an effective pulse signal, wherein m is an arbitrary odd number between 1 and N−1−x;

a buffer unit at level k is connected to an output end of a shift register unit at level k, an output end of a shift register unit at level k+1+x and a touch control switch unit corresponding to the shift register unit at level k, and configured to output an effective pulse signal under control of the touch control switch unit corresponding to the shift register unit at level k only when the output end of the shift register unit at level k outputs an effective pulse signal, or configured to start outputting an effective pulse signal when the output end of the shift register unit at level k outputs an effective pulse signal, and to stop outputting the effective pulse signal output by the buffer unit at level k when the output end of the shift register unit at level k+1+x outputs an effective pulse signal, wherein k is an arbitrary even number between 1 and N−1−x.

13. The display panel of claim 12, wherein a buffer unit corresponding to the shift register unit at level n comprises: an input module, a reset module, a node control module, a first output module and a second output module, wherein:

the input module is configured to supply a signal from the output end of the shift register unit at level n to a first node under control of the output end of the shift register unit at level n;

the reset module is configured to supply a signal from a first reference voltage end to the first node under control of an output end of a shift register unit at level n+1+x;

the node control module is configured to control the first node and a second node to have opposite potentials, and to control the first node to have a high potential after the output end of the shift register unit at level n outputs a signal and before the output end of the shift register unit at level n+x outputs a signal;

the first output module is configured to supply a signal from a second reference voltage end to an output end of the buffer unit corresponding to the shift register unit at level n under control of the first node; and the second output module is configured to supply the signal from the first reference voltage end to the output end of the buffer unit corresponding to the shift register unit at level n under control of the second node.

14. The display panel of claim 13, wherein the node control module comprises: a first node control submodule and a second node control submodule, wherein:

the first node control submodule is configured to supply the signal from the first reference voltage end to the first node under control of the second node, and to further improve a potential of the first node under control of a node control end, wherein the node control end is connected to an output end of a shift register unit at level n+1, n+2 or n+x; and the second node control submodule is configured to supply the signal from the second reference voltage end to the second node under control of the second reference voltage end, and to supply the signal from the first reference voltage end to the second node under control of the first node;

wherein the first node control submodule comprises: a first switch transistor and a capacitor, wherein:

for the first switch transistor, a gate of the first switch transistor is connected to the second node, a first electrode of the first switch transistor is connected to the first node, and a second electrode of the first switch transistor is connected to the first reference voltage end; and for the capacitor, a first end of the capacitor is connected to the first node, and a second end of the capacitor is connected to the node control end;

wherein the second node control submodule comprises: a second switch transistor and a third switch transistor, wherein:

for the second switch transistor, a gate of the second switch transistor and a first electrode of the second switch transistor are both connected to the second reference voltage end, and a second electrode of the second switch transistor is connected to the second node;

for the third switch transistor, a gate of the third switch transistor is connected to the first node, a first electrode of the third switch transistor is connected to the second node, and a second electrode of the third switch transistor is connected to the first reference voltage end.

15. The display panel of claim 13, wherein the input module comprises: a fourth switch transistor, wherein:

for the fourth switch transistor, a gate of the fourth switch transistor and a first electrode of the fourth switch transistor are both connected to the output end of the shift register unit at level n, and a second electrode of the fourth switch transistor is connected to the first node.

16. The display panel of claim 13, wherein the reset module comprises: a fifth switch transistor, wherein:

for the fifth switch transistor, a gate of the fifth switch transistor is connected to the output end of the shift register unit at level n+1+x, a first electrode of the fifth switch transistor is connected to the first node, and a second electrode of the fifth switch transistor is connected to the first reference voltage end.

17. The display panel of claim 13, wherein the first output module comprises: a sixth switch transistor, wherein:
for the sixth switch transistor, a gate of the sixth switch transistor is connected to the first node, a first electrode of the sixth switch transistor is connected to the second reference voltage end, and a second electrode of the sixth switch transistor is connected to the output end of the buffer unit corresponding to the shift register unit at level n.

18. The display panel of claim 13, wherein the second output module comprises: a seventh switch transistor, wherein:
for the seventh switch transistor, a gate of the seventh switch transistor is connected to the second node, a first electrode of the seventh switch transistor is connected to the output end of the buffer unit corresponding to the shift register unit at level n, and a second electrode of the seventh switch transistor is connected to the first reference voltage end.

19. The display panel of claim 13, wherein each of touch control switch units corresponding to the shift register units at even levels comprises: an eighth switch transistor, wherein:
for the eighth switch transistor, a gate of the eighth switch transistor is connected to a third reference voltage end, a first electrode of the eighth switch transistor is connected to an output end of a shift register unit at a corresponding level, and a second electrode of the eighth switch transistor is connected to the first node.

20. A driving method for the gate drive circuit of claim 1, comprising:
when the gate drive circuit needs to operate in a first mode, controlling the shift register units connected in cascade to output effective pulse signals in sequence, and controlling each of the buffer units which are in a one-to-one correspondence with the shift register units at all levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal; or
when the gate drive circuit needs to operate in a second mode, controlling the shift register units connected in cascade to output effective pulse signals in sequence; and controlling each of buffer units which are in a one-to-one correspondence with shift register units at odd levels to start outputting an effective pulse signal when an output end of a shift register unit at a corresponding level outputs an effective pulse signal, and to stop outputting its effective pulse signal when an output end of a shift register unit at level 1+x thereafter outputs an effective pulse signal; and controlling each of the buffer units which are in a one-to-one correspondence with the shift register units at even levels to output an effective pulse signal under control of a touch control switch unit corresponding to a shift register unit at a corresponding even level only when an output end of said shift register unit at the corresponding even level outputs an effective pulse signal.

* * * * *